United States Patent
Yang et al.

(10) Patent No.: US 12,422,721 B2
(45) Date of Patent: Sep. 23, 2025

(54) VARISTOR FOR PREVENTING TRACE MURA CAUSED BY A HARD OBJECT SCRATCHED ACROSS THE SURFACE OF A SCREEN

(71) Applicant: HKC CORPORATION LIMITED, Shenzhen (CN)

(72) Inventors: Weishi Yang, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/145,200

(22) Filed: Dec. 22, 2022

(65) Prior Publication Data
US 2023/0375888 A1   Nov. 23, 2023

(30) Foreign Application Priority Data
May 23, 2022   (CN) .................. 202210563735.X (51) Int. Cl.
| | |
|---|---|
| *G09G 3/20* | (2006.01) |
| *G02F 1/1362* | (2006.01) |
| *G02F 1/1368* | (2006.01) |
| *G09G 3/36* | (2006.01) |
| *H10D 86/01* | (2025.01) |
| *H10D 86/40* | (2025.01) |
| *H10D 86/60* | (2025.01) |

(52) U.S. Cl.
CPC ...... *G02F 1/1368* (2013.01); *G02F 1/136213* (2013.01); *G09G 3/3648* (2013.01); *H10D 86/021* (2025.01); *H10D 86/451* (2025.01); *H10D 86/60* (2025.01); *G09G 2300/0426* (2013.01); *G09G 2300/0842* (2013.01); *G09G 2320/0257* (2013.01)

(58) Field of Classification Search
CPC ............ G02F 1/1368; G02F 1/136213; G09G 3/3648; G09G 2300/0426; G09G 2320/0257; H01L 27/1248; H01L 27/1259
See application file for complete search history.

(56) References Cited

U.S. PATENT DOCUMENTS

| | | | | |
|---|---|---|---|---|
| 6,084,579 | A * | 7/2000 | Hirano | G09G 3/3225 315/169.3 |
| 2003/0062843 | A1* | 4/2003 | Katakura | H01J 29/96 315/169.3 |
| 2004/0256996 | A1* | 12/2004 | Osame | G09G 3/3233 315/169.1 |
| 2013/0329153 | A1* | 12/2013 | Yu | G02F 1/136213 349/43 |
| 2014/0300251 | A1* | 10/2014 | Colli | G06F 3/03547 29/25.35 |
| 2020/0168155 | A1* | 5/2020 | Xiong | H10K 59/123 |

* cited by examiner

*Primary Examiner* — Amr A Awad
*Assistant Examiner* — Donna V Bocar
(74) *Attorney, Agent, or Firm* — Maier & Maier, PLLC (57) ABSTRACT

A pixel driving structure includes a switching transistor, and further includes: a first positive pressure coefficient varistor circuit. A first end of the first positive pressure coefficient varistor circuit is electrically connected with a drain electrode of the switching transistor, and a second end of the first positive pressure coefficient varistor circuit is electrically connected with the pixel electrode. The pixel driving structure can improve a problem of occurrence of Trace Mura phenomenon of the display panel.

7 Claims, 4 Drawing Sheets

VARISTOR FOR PREVENTING TRACE MURA CAUSED BY A HARD OBJECT SCRATCHED ACROSS THE SURFACE OF A SCREEN

CROSS-REFERENCE TO RELATED APPLICATION

Pursuant to 35 U.S.C. § 119 and the Paris Conversion, this application claims priority to Chinese Patent Application No. 202210563735.X filed May 23, 2022, the entire contents of which are incorporated herein by reference.

TECHNICAL FIELD

The present application relates to the field of display technologies, and particularly to a pixel driving structure, a preparation method and a display panel.

BACKGROUND

Currently, a Trace Mura phenomenon occurs frequently in display panel. The Trace Mura phenomenon is that, when a hard object scratches across a surface of a screen (without generating any physical damage to the screen itself and a surface film layer) of the display panel, an abnormal display of white line occurs at a scratched position, and the white line can only disappear after a long period of time. This Trace Mura phenomenon occurring in the display panel may cause a user experience to be worse.

SUMMARY

Embodiments of the present application provide a pixel driving structure, a preparation method and a display panel, which aim to achieve the objective of improving the problem of occurrence of the Trace Mura phenomenon in the display panel.

In order to achieve the objective, in the first aspect, a pixel driving structure is provided in the embodiments of the present application, the pixel driving structure includes a switching transistor and a pixel electrode, and further includes:
  a first positive pressure coefficient varistor circuit, where a first end of the first positive pressure coefficient varistor circuit is electrically connected with a drain electrode of the switching transistor, and a second end of the first positive pressure coefficient varistor circuit is electrically connected with the pixel electrode.

As an alternative, the pixel driving structure includes a capacitor circuit and a second positive pressure coefficient varistor circuit, where a first end of the capacitor circuit is electrically connected with a drain electrode of the switching transistor and the pixel electrode, a second end of the capacitor circuit is electrically connected with the first end of the second positive pressure coefficient varistor circuit, and a second end of the second positive pressure coefficient varistor circuit is electrically connected with a common voltage terminal.

In some embodiments, the switching transistor is provided with a via hole extending from a protective layer of the switching transistor to a layer where the pixel electrode is located, the first positive pressure coefficient varistor circuit is formed between the via hole and a gate electrode of the switching transistor and the pixel electrode, the first end of the first positive pressure coefficient varistor circuit is in contact with the drain electrode of the switching transistor, and the second end of the first positive pressure coefficient varistor circuit is in contact with the pixel electrode.

In some embodiments, the switching transistor is provided with a via hole extending from a protective layer of the switching transistor to a layer where the pixel electrode is located, the second positive pressure coefficient varistor circuit and the capacitor circuit are formed between the via hole, and the gate electrode of the switching transistor and the pixel electrode. A first end of the capacitor circuit is in contact with the drain electrode of the switching transistor and the pixel electrode, a second end of the capacitor circuit is in contact with the first end of the second positive pressure coefficient varistor circuit, and the second end of the second positive pressure coefficient varistor circuit is in contact with the common voltage terminal.

In some embodiments, the first positive pressure coefficient varistor circuit includes at least one positive pressure coefficient varistor. When the first positive pressure coefficient varistor circuit includes at least two positive pressure coefficient varistors, the at least two positive pressure coefficient varistors are connected in series.

As an alternative, the second positive pressure coefficient varistor circuit includes at least one positive pressure coefficient varistor. When the second positive pressure coefficient varistor circuit includes at least two positive pressure coefficient varistors, the at least two positive pressure coefficient varistors are connected in series. The capacitor circuit includes at least one capacitor. When the capacitor circuit includes at least two capacitors, the at least two capacitors are connected in parallel.

In some embodiments, a scanning signal and a data signal are received at a gate electrode and a source electrode of the switching transistor, respectively.

The pixel driving structure further includes a storage capacitor formed between the pixel electrode and the common electrode.

The common electrode is formed on a protective layer of the switching transistor.

In some embodiments, the switching transistor is a thin film transistor (TFT) which includes a protective layer, a drain electrode, a source electrode, an active island, a gate insulating layer, and a gate electrode.

The protective layer is configured to be covered on the drain electrode and the source electrode, the drain electrode and the source electrode are configured to be covered on the active island, the active island includes an ohmic contact layer and an active layer sequentially laminated and covered on the gate insulating layer, and the gate insulating layer is covered on the gate electrode.

In the second aspect, a method for preparing a pixel driving structure is provided in the embodiments of the present application, the method includes:
  preparing a switching transistor on a substrate; where the switching transistor is provided with a via hole extending from a protective layer of the switching transistor to a layer where a pixel electrode is located; and
  forming a first positive pressure coefficient varistor circuit between the via hole, and the gate electrode of the switching transistor and the pixel electrode; where a first end of the first positive pressure coefficient varistor circuit is in contact with a drain electrode of the switching transistor, and a second end of the first positive pressure coefficient varistor circuit is in contact with the pixel electrode;
  or alternatively, forming a second positive pressure coefficient varistor circuit and a capacitor circuit between the via hole and the gate electrode of the switching transistor and the pixel electrode; where a first end of the capacitor circuit is in contact with a drain electrode of the switching transistor and the pixel electrode, a second end of the capacitor circuit is in contact with a first end of the second positive pressure coefficient varistor circuit, and a second end of the second positive pressure coefficient varistor circuit is in contact with a common voltage terminal.

In some embodiments, said forming the first positive pressure coefficient varistor circuit between the via hole and the gate electrode of the switching transistor and the pixel electrode includes:

using a pressure-sensitive material to form the first positive pressure coefficient varistor circuit between the via hole and the gate electrode of the switching transistor and the pixel electrode.

In some embodiments, said forming the second positive pressure coefficient varistor circuit and the capacitor circuit between the via hole, and the gate electrode of the switching transistor and the pixel electrode includes:

using a pressure-sensitive material to form the second positive pressure coefficient varistor circuit between the via hole and the gate electrode of the switching transistor and the pixel electrode, and forming the capacitor circuit between the gate electrode of the switching transistor and the pixel electrode.

In the third aspect, a display panel is provided in the embodiments of the present application, the display panel includes the aforesaid pixel driving structure.

As compared to the existing technologies, the embodiments of the present application have the following beneficial effects:

when a hard object scratches across the surface of the screen, the first positive pressure coefficient varistor circuit corresponding to the position scratched by the hard object is extruded to be deformed, a resistance value of the first positive pressure coefficient varistor circuit is increased, and a divided voltage of the first positive pressure coefficient varistor circuit is increased, so that the voltage on the pixel electrode is decreased, and an electric field between the pixel electrode and the common electrode is weakened, and the deflection angles of the liquid crystal molecules in the electric field are reduced accordingly. After the pressure applied on the surface of the screen is removed, the liquid crystal molecules can be quickly restored to their respective original positions, the problem of occurrence of the Trace Mura phenomenon of the display panel is improved.

When the hard object scratches across the surface of the screen, the second positive pressure coefficient varistor circuit corresponding to the position scratched by the hard object is extruded to be deformed, a resistance value of the second positive pressure coefficient varistor circuit is increased, and a divided voltage of the second positive pressure coefficient varistor circuit is increased, so that the voltage on the two ends of the capacitor circuit is decreased. Since the voltage on the two ends of the capacitor circuit cannot be suddenly changed, the voltage at the first end of the capacitor circuit is decreased, so that the voltage on the pixel electrode is decreased, the electric field between the pixel electrode and the common electrode is weakened, and the deflection angles of the liquid crystal molecules in the electric field are reduced accordingly. After the pressure applied on the surface of the screen is removed, the liquid crystal molecules can be quickly restored to their respective original positions, so that the problem of occurrence of Trace Mura phenomenon of the display panel is improved.

BRIEF DESCRIPTION OF THE DRAWINGS

In order to describe the technical solutions in the embodiments of the present application more clearly, a brief introduction regarding the accompanying drawings that need to be used for describing the embodiments of the present application or the existing technology is given below. It is apparent that the accompanying drawings described below are merely some embodiments of the present application, a person of ordinary skill in the art may also acquire other drawings according to the current drawings without paying creative labor.

DETAILED DESCRIPTION OF THE EMBODIMENTS

In the following descriptions, in order to describe but not intended to limit the present application, concrete details including specific system structure and technique are proposed, so that a comprehensive understanding of the embodiments of the present application is facilitated. However, a person of ordinarily skill in the art should understand that, the present application can also be implemented in some other embodiments from which these concrete details are excluded. In other conditions, detailed explanations of method, circuit, device and system well known to the public are omitted, so that unnecessary details which are disadvantageous to understanding of the description of the present application may be avoided.

It should be understood that, when a term "comprise/include" is used in the description and annexed claims, the term "comprise/include" indicates existence of the described characteristics, integer, steps, operations, elements and/or components, but not exclude existence or adding of one or more other characteristics, integer, steps, operations, elements, components and/or combination thereof.

As is used in the description and the annexed claims, a term "if" may be interpreted as "when" or "once" or "in response to determination" or "in response to detection". Similarly, terms such as "if it is determined that", or "if it is detected that (a described condition or event)" may be interpreted as "once it is determined" or "in response to the determination" or "once it is detected that (the described condition or event)" or "in response to the detection (the described condition or event)".

Moreover, in the descriptions of the present application, terms such as "first" and "second", etc., are only intended to be distinguished in description, but shouldn't be interpreted as indicating or implying a relative importance.

The descriptions of "referring to one embodiment" and "referring to some embodiments", and the like as described in the specification of the present application means that a specific feature, structure, or characters which are described with reference to this embodiment are included in one embodiment or some embodiments of the present application. Thus, the sentences of "in one embodiment", "in some embodiments", "in some other embodiments", "in other embodiments", and the like in this specification are not necessarily referring to the same embodiment, but instead indicate "one or more embodiments instead of all embodiments", unless there is a special emphasis in other manner otherwise. The terms "comprising", "including", "having" and their variations mean "including but is not limited to", unless otherwise they are specially emphasized in other manner.

A pixel driving structure includes a switching transistor, where a source electrode of the switching transistor is electrically connected with a source driver, a drain electrode of the switching transistor is electrically connected with a pixel electrode, and a gate electrode of the switching transistor is electrically connected with a gate driver. The gate driver is configured to control the switching transistor to be switched on or be switched off. When the switching transistor is in a switched on state, a driving voltage Vdata output by the source driver is exerted on the pixel electrode through the source electrode and the drain electrode of the switching transistor. A driving voltage on the common electrode is Vcom, an electric field is generated between the pixel electrode and the common electrode, and liquid crystal molecules in the liquid crystal layer are deflected at an angle under the action of the electric field. The higher the driving voltage Vdata exerted on the pixel electrode, the stronger the electric field between the pixel electrode and the common electrode, and the larger the deflection angles of the liquid crystal molecules within the electric field, the lower the driving voltage Vdata exerted on the pixel electrode, the weaker the electric field between the pixel electrode and the common electrode, and the smaller the deflection angles of the liquid crystal molecules within the electric field. The deflection angles of the liquid crystal molecules in the liquid crystal layer is changed by controlling the driving voltage Vdata exerted on the pixel electrode, a light transmittance of the liquid crystal layer is further changed, and the displaying of images of the display panel is realized.

When a hard object scratches across a surface of a screen of the display panel, the liquid crystal molecules in the liquid crystal layer are deflected at a large angle under the combination of an acting force of the electric field between the pixel electrode and the common electrode and the pressure on the screen. After the pressure of the hard object on the screen is removed, the liquid crystal molecules cannot be restored to their respective original positions in a short time, so that an occurrence of Trace Mura phenomenon is caused.

First Embodiment

Figure 1:
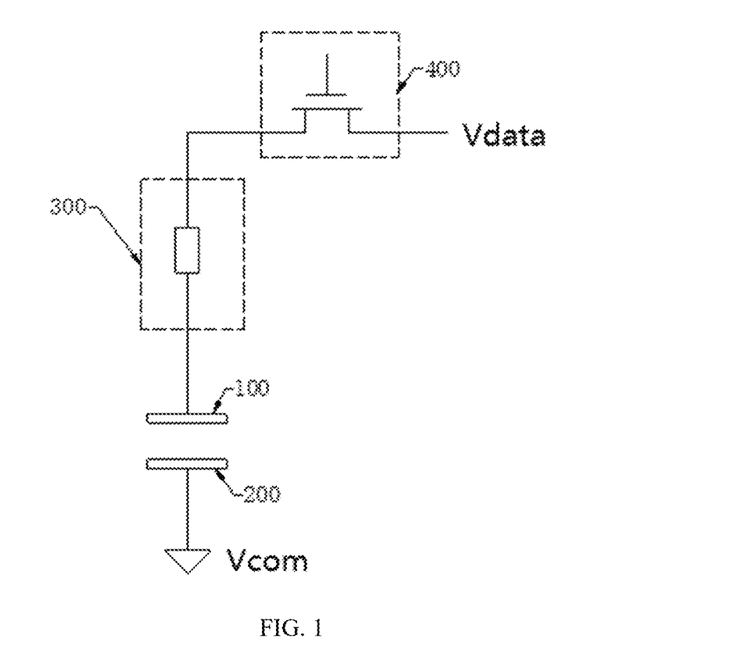
FIG. 1 illustrates a schematic diagram of connection of a pixel driving structure according to the first embodiment of the present application.

As shown in FIG. 1, the pixel driving structure according to this embodiment of the present application includes a switching transistor 400 and a first positive pressure coefficient varistor circuit 300, where a first end of the first positive pressure coefficient varistor circuit 300 is electrically connected with a drain electrode of the switching transistor 400, and a second end of the first positive pressure coefficient varistor circuit 300 is electrically connected with the pixel electrode 100.

In particular, when the switching transistor 400 is in a switched on state, the driving voltage Vdata is exerted on the pixel electrode 100 through the source electrode 404, the drain electrode 401 of the switching transistor 400 and the first positive pressure coefficient voltage-sensitive resistor circuit 300, the driving voltage exerted on the common electrode 200 is Vcom, an electric field is generated between the pixel electrode 100 and the common electrode 200, and the liquid crystal molecules in the liquid crystal layer are deflected at an angle under the action of the electric field, so that the light transmittance of the liquid crystal layer is changed, and displaying of images of the display panel is realized.

When the hard object scratches across the surface of the screen of the display panel, the first positive pressure coefficient varistor circuit 300 corresponding to the position scratched by the hard object is extruded. When the first positive pressure coefficient varistor circuit 300 generated deformation when it is extruded, the resistance value of the first positive pressure coefficient varistor circuit 300 becomes greater, and the divided voltage of the first positive pressure coefficient varistor circuit 300 becomes greater. Since the driving voltage Vdata is invariable, the voltage exerted on the pixel electrode 100 is reduced due to the increasing of the divided voltage of the first positive pressure coefficient varistor circuit 300. Furthermore, due to the fact that the driving voltage Vcom exerted on the common electrode 200 is invariable, the electric field between the pixel electrode 100 and the common electrode 200 becomes weakened, and thus the deflection angles of the liquid crystal molecules in the electric field are reduced. After the pressure of the hard object applied on the screen is removed, the liquid crystal molecules can be quickly restored to their respective original positions, so that the problem of Trace Mura of the display panel is improved.

Figure 2:
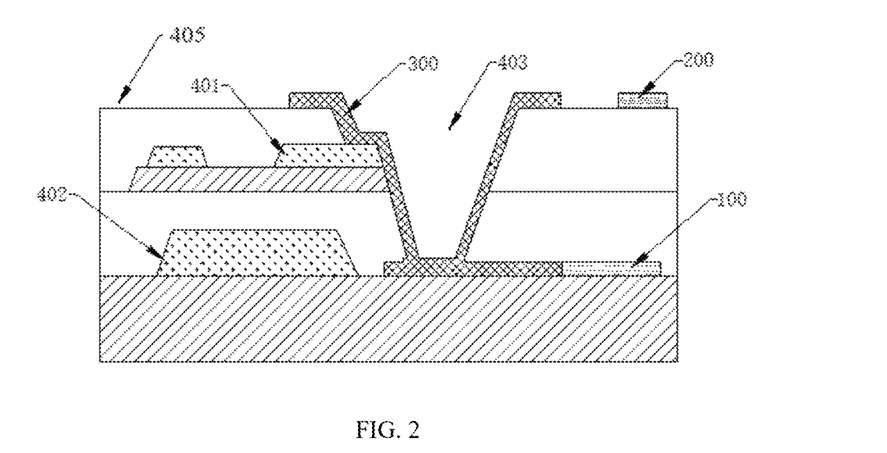
FIG. 2 illustrates a schematic structural diagram of the pixel driving structure according to the first embodiment of the present application.

As shown in FIG. 2, the switching transistor 400 is provided with a via hole 403 extending from a protective layer 405 of the switching transistor 400 to a layer where the pixel electrode 100 is located, the first positive pressure coefficient varistor circuit 300 is formed between the via hole 403, and the gate electrode 402 of the switching transistor 400 and the pixel electrode 100. A first end of the first positive pressure coefficient varistor circuit 300 is in contact with the drain electrode 401 of the switching transistor 400, and a second end of the first positive pressure coefficient varistor circuit 300 is in contact with the pixel electrode 100.

In particular, the pixel electrode 100 and the gate electrode 402 of the switching transistor 400 are located on the same layer, the protective layer 405 of the switching transistor 400 is provided with the via hole 403, the first positive pressure coefficient varistor circuit 300 is formed between the via hole 403, and the gate electrode 402 of the switching transistor 400 and the pixel electrode 100, and the first end of the first positive pressure coefficient varistor circuit 300 is enabled to be in contact with the drain electrode 401 of the switching transistor 400, and the second end of the first positive pressure coefficient varistor circuit 300 is enabled to be in contact with the pixel electrode 100, such that the first positive pressure coefficient varistor circuit 300 and the pixel electrode 100 are constituted as a series circuit.

When the hard object scratches across the surface of the screen of the display screen, the first positive pressure coefficient varistor circuit 300 corresponding to the position scratched by the hard object is extruded to be deformed, so that the resistance value of the first positive pressure coefficient varistor circuit 300 becomes greater, and the divided voltage of the first positive pressure coefficient varistor circuit 30 is increased accordingly. Since the driving voltage Vdata is invariable, the increased divided voltage of the first positive pressure coefficient varistor circuit 300 causes the voltage on the pixel electrode 100 to be decreased, so that the electric field between the pixel electrode 100 and the common electrode 200 becomes weaker, and the deflection angles of the liquid crystal molecules within the electric field are reduced. After the pressure of the hard object on the screen is removed, the liquid crystal molecules can be quickly restored to their respective original positions, so that the problem of occurrence of Trace Mura phenomenon of the display panel is improved.

In one embodiment of the present application, the first positive pressure coefficient varistor circuit 300 includes at least one positive pressure coefficient varistor. When the first positive pressure coefficient varistor circuit 300 includes at least two positive pressure coefficient varistors resistors, the at least two positive pressure coefficient varistors resistors are connected in series.

In particular, the first positive pressure coefficient varistor circuit 300 may include a positive pressure coefficient varistor, or include a plurality of positive pressure coefficient varistors connected in series. A designer may set the number and the arrangement of the positive pressure coefficient varistors in the first positive pressure coefficient varistor circuit 300 to meet actual structural requirement and resistance requirement according to actual requirement.

For example, when the first positive pressure coefficient varistor circuit 300 is not extruded, the resistance value of the first positive pressure coefficient varistor circuit 300 is less than a first preset value, where the first preset value is 1 ohm, 2 ohm or 5 ohm. It is ensured that the resistance value of the first positive pressure coefficient varistor circuit 300 is small enough and the divided voltage is small enough, and it is ensured that the voltage on the pixel electrode 100 approaches a driving voltage, so that the control precision of the deflection angles of the liquid crystal molecules is improved, and the display effect is improved accordingly.

Figure 3:
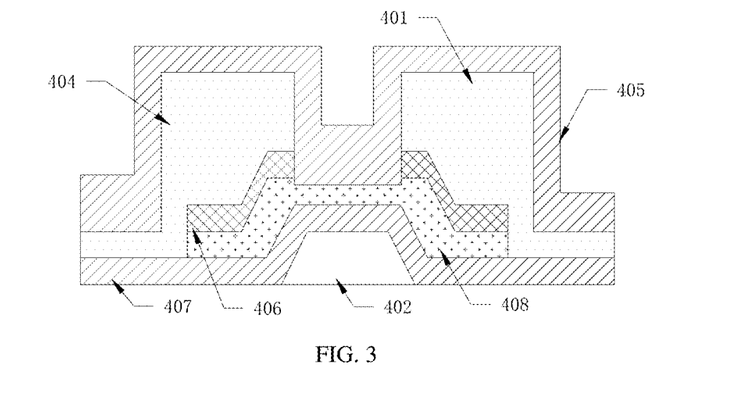
FIG. 3 is a first schematic structural diagram of a switching transistor according to the first embodiment of the present application.

As shown in FIG. 3, the switching transistor 400 is a thin film transistor (Thin Film Transistor, TFT), and includes a protective layer 405, a drain electrode 401, a source electrode 404, an active island, a gate insulating layer 407 and a gate electrode 402, the protective layer 405 is configured to be covered on the drain electrode 401 and the source electrode 404, the drain electrode 401 and the source electrode 404 are configured to be covered on the active island. The active island includes an ohmic contact layer 406 and an active layer 408 laminated in sequence and covering the gate insulating layer 407. The gate insulating layer 407 is configured to be covered on the gate electrode 402.

In application, the gate electrode 402 of the switching transistor 400 is electrically connected with a gate driver, the source electrode 404 of the switching transistor 400 is electrically connected with a source driver, and the drain electrode 401 of the switching transistor 400 is electrically connected with the pixel electrode 100 through the first positive pressure coefficient varistor circuit 300. When the gate driver controls the switching transistor 400 to be in the switched on state, the driving voltage Vdata output by the source driver is exerted on the pixel electrode 100 through the source electrode 404 and the drain electrode 401 of the switching transistor 400, and the first positive pressure coefficient varistor circuit 300, so that an electric field is generated between the pixel electrode 100 and the common electrode 200, the deflection angles of the liquid crystal molecules in the liquid crystal layer are changed, the light transmittance of the liquid crystal layer is further changed, and displaying of images of the display panel picture is realized. When the gate driver controls the switching transistor 400 to be in the switched off state, the driving voltage Vdata output by the source driver cannot be exerted on the pixel electrode 100, in this condition, the pixels are inactivated.

In one embodiment of the present application, a scan signal and a data signal are received at the gate electrode 402 and the source electrode 404 of the switching transistor 400 respectively. A storage capacitor is formed between the pixel electrode 100 and the common electrode 200, and the common electrode 200 is formed on the protection layer 405 of the switching transistor 400.

In application, the storage capacitor is a parallel plate capacitor formed between the trace of the drain electrode 401 of the TFT and the trace of the common electrode 200. As an alternative, the storage capacitor may also be a parallel plate capacitor formed between the trace of the drain electrode 401 of the TFT and the trace of the gate electrode 402 of a subsequent TFT. The common electrode 200 is formed on the protective layer 405 of the switching transistor 400. The pixel electrode 100 and the gate electrode 402 of the switching transistor 400 are located on the same layer, the pixel electrode 100 and the common electrode 200 are constituted as a capacitor structure. When the driving voltage Vdata is exerted on the pixel electrode 100, the electric field can be generated between the pixel electrode 100 and the common electrode 200, so that the deflection angles of the liquid crystal molecules can be controlled.

Second Embodiment

Figure 4:
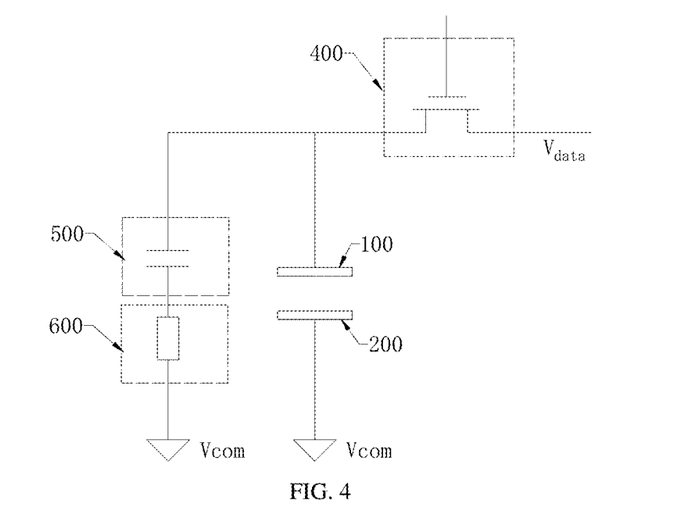
FIG. 4 illustrates a schematic diagram of connection of a pixel driving structure according to the second embodiment of the present application.

As shown in FIG. 4, the pixel driving structure includes a switching transistor 400, a capacitor circuit 500, and a second positive pressure coefficient varistor circuit 600. A first end of the capacitor circuit 500 is electrically connected with a drain electrode 401 of the switching transistor 400 and a pixel electrode 100, a second end of the capacitor circuit 500 is electrically connected with a first end of the second positive pressure coefficient varistor circuit 600, and a second end of the second positive pressure coefficient varistor circuit 600 is electrically connected with a common voltage terminal.

In particular, the common voltage terminal may be a common electrode 200 or a trace for connecting the common electrode 200, and the driving voltage is Vcom. When a hard object scratches across a surface of a screen of a display, the second positive pressure coefficient varistor circuit 600 corresponding to the position scratched by the hard object is extruded to be deformed, the resistance value of the second positive pressure coefficient varistor circuit 600 becomes greater, the divided voltage of the second positive pressure coefficient varistor circuit 600 is increased, such that the voltage on the second end of the capacitor circuit 500 is decreased, and thus the voltage on the first end of the capacitor circuit 500 is decreased due to the fact that the voltage at the two ends of the capacitor circuit 500 cannot be suddenly changed. When the switching transistor 400 is in the switched off state, the voltage exerted on the pixel electrode 100 is pulled down by the capacitor circuit 500, such that the voltage on the pixel electrode 100 is reduced. Furthermore, since the driving voltage Vcom on the common electrode 200 is invariable, the electric field between the pixel electrode 100 and the common electrode 200 becomes weakened, so that the deflection angles of the liquid crystal molecules in the electric field are reduced. After the pressure on the surface of the screen is removed, the liquid crystal molecules can be quickly restored to their respective original positions, so that the problem of occurrence of Trace Mura phenomenon of the display panel is improved.

In one embodiment of the present application, the switching transistor 400 is provided with a via hole 403 extending from the protective layer 405 of the switching transistor 400 to the layer where the pixel electrode 100 is located, the second positive pressure coefficient varistor circuit 600 and the capacitor circuit 500 are formed between the gate electrode 402 of the switching transistor 400 and the pixel electrode 100. The first end of the capacitor circuit 500 is in contact with the drain electrode 401 of the switching transistor 400 and the pixel electrode 100, the second end of the capacitor circuit 500 is in contact with the first end of the second positive pressure coefficient varistor circuit 600, and the second end of the second positive pressure coefficient varistor circuit 600 is in contact with the common voltage terminal.

In particular, the capacitor circuit 500 and the pixel electrode 100 may be located on the same layer, and the position where the second positive pressure coefficient varistor circuit 600 is formed may be the same as the position where the first positive pressure coefficient varistor circuit 300 is formed as disclosed in the first embodiment. When the hard object scratches across the surface of the screen, the second positive pressure coefficient varistor circuit 600 corresponding to the position scratched by the hard object is extruded to be deformed, the resistance value of the second positive pressure coefficient varistor circuit 600 be is increased, the divided voltage of the second positive pressure coefficient varistor circuit 600 is increased, so that the voltage on the first end of the capacitor circuit 500 is decreased, so that the voltage on the pixel electrode 100 is decreased, and the electric field between the pixel electrode 100 and the common electrode 200 becomes weakened, so that the deflection angles of the liquid crystal molecules within the electric field are reduced. After the pressure on the surface of the screen is removed, the liquid crystal molecules can be quickly restored to their respective original positions, so that the problem of occurrence of Trace Mura phenomenon of the display panel is improved.

In one embodiment of the present application, the second positive pressure coefficient varistor circuit 600 includes at least one positive pressure coefficient varistor. When the second positive pressure coefficient varistor circuit 600 includes at least two positive pressure coefficient varistors resistors, the at least two positive pressure coefficient varistors resistors are connected in series. The capacitor circuit 500 includes at least one capacitor. When the capacitor circuit 500 includes at least two capacitors, the at least two capacitors are connected in parallel.

In particular, the designer may set the number and the arrangements of the positive pressure coefficient varistors in the second positive pressure coefficient varistor circuit 600 according to actual requirements so as to meet actual structural requirement and resistance requirement. Moreover, the designer can also set the number and the arrangement of the capacitors in the capacitor circuit 500 according to actual requirements so as to meet actual structural requirement and the requirement on capacitances of the capacitors.

The structure of the switching transistor 400 in this embodiment is the same as the structure of the switching transistor 400 in the first embodiment, so that the details of the structure of the switching transistor 400 in this embodiment are not repeatedly described herein.

Third Embodiment

Figure 5:
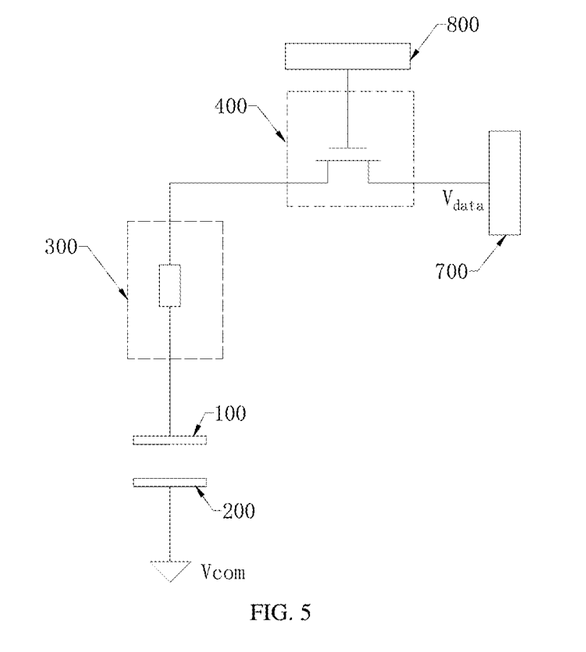
FIG. 5 illustrates a schematic diagram of connection of a pixel drive circuit according to a third embodiment of the present application.

As shown in FIG. 5, the pixel drive circuit includes a source driver 700, a gate driver 800, and a pixel driving structure in the first embodiment. A source electrode 404 of the switching transistor 400 is electrically connected with the source driver 700, a gate electrode 402 of the switching transistor 400 is electrically connected with the gate driver 800, and a drain electrode 401 of the switching transistor 400 is electrically connected with the pixel electrode 100 through the first positive pressure coefficient varistor circuit 300.

In particular, the voltage signal output by the gate driver 800 is used to control the switching transistor 400 to be switched on or be switched off. When the gate driver 800 outputs a high level signal, the switching transistor 400 is switched on; when the gate driver 800 outputs a low level signal, the switching transistor 400 is switched off. When the switching transistor 400 is switched on, the driving voltage Vdata output by the source driver 700 is exerted on the pixel electrode 100 through the source electrode 404, the drain electrode 401 of the switching transistor 400 and the first positive pressure coefficient varistor circuit 300, so that an electric field is generated between the pixel electrode 100 and the common electrode 200, the deflection angles of the liquid crystal molecules in the liquid crystal layer are changed, the light transmittance of the liquid crystal layer is further changed, and the displaying of images of the display panel is realized. When the hard object scratches across the surface of the screen, the first positive pressure coefficient varistor circuit 300 corresponding to the position scratched by the hard object is extruded to be deformed, so that the resistance value of the first positive pressure coefficient varistor circuit 300 is increased, and the divided voltage of the first positive pressure coefficient varistor circuit 300 is increased accordingly. Since the driving voltage Vdata is invariable, so that the increased divided voltage of the first positive pressure coefficient varistor circuit 300 causes the voltage on the pixel electrode 100 to be decreased, and the electric field between the pixel electrode 100 and the common electrode 200 becomes weakened, and the deflection angles of the liquid crystal molecules in the electric field are reduced accordingly. After the pressure of the hard object pressed on the screen is removed, the liquid crystal molecules can be quickly restored to their respective original positions, so that the problem of occurrence of Trace Mura phenomenon of the display panel is improved.

Fourth Embodiment

Figure 6:
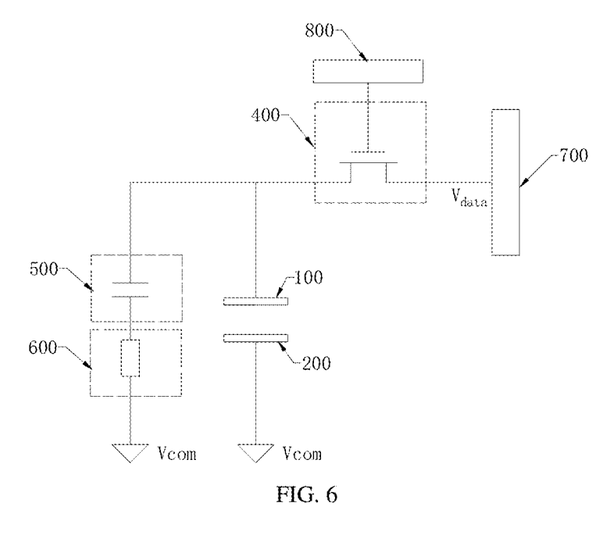
FIG. 6 illustrates a schematic diagram of connection of a pixel drive circuit according to a fourth embodiment of the present application.

As shown in FIG. 6, the pixel drive circuit includes a source driver 700, a gate driver 800, and a pixel driving structure in the second embodiment. A source electrode 404 of the switching transistor 400 is electrically connected with the source driver 700, a gate electrode 402 of the switching transistor 400 is electrically connected with the gate driver 800, and a drain electrode 401 of the switching transistor 400 is electrically connected with the pixel electrode 100 and a first end of the capacitor circuit 500, respectively. A second end of the capacitor circuit 500 is electrically connected with the common electrode 200 through the second positive pressure coefficient varistor circuit 600.

In particular, the voltage signal output by the gate driver 800 is used to control the switching transistor 400 to be switched on or be switched off. When the gate driver 800 outputs a high level signal, the switching transistor 400 is switched on; when the gate driver 800 outputs a low level signal, the switching transistor 400 is switched off. When the switching transistor 400 is switched on, the driving voltage Vdata output by the source driver 700 is exerted on the pixel electrode 100 through the source electrode 404 and the drain electrode 401 of the switching transistor 400, so that an electric field is generated between the pixel electrode 100 and the common electrode 200, the deflection angles of the liquid crystal molecules in the liquid crystal layer are changed, the light transmittance of the liquid crystal layer is further changed, so that the displaying of images of the display panel is realized. When the hard object scratches across the surface of the screen, the second positive pressure coefficient varistor circuit 600 corresponding to the position scratched by the hard object is extruded to be deformed, the resistance value of the second positive pressure coefficient varistor circuit 600 is increased, the divided voltage of the second positive pressure coefficient varistor circuit 600 is increased, so that the voltage on the second end of the capacitor circuit 500 is decreased. Since the voltage at the two ends of the capacitor circuit 500 cannot be suddenly changed, so that the voltage at the first end of the capacitor circuit 500 is decreased, the electric field generated between the pixel electrode 100 and the common electrode 200 becomes weakened, and the deflection angles of the liquid crystal molecules within the electric field are reduced. After the pressure pressed on the surface of the screen is removed, the liquid crystal molecules can be quickly restored to their respective original positions, so that the problem of occurrence of Trace Mura phenomenon of the display panel is improved.

Fifth Embodiment

Figure 7:
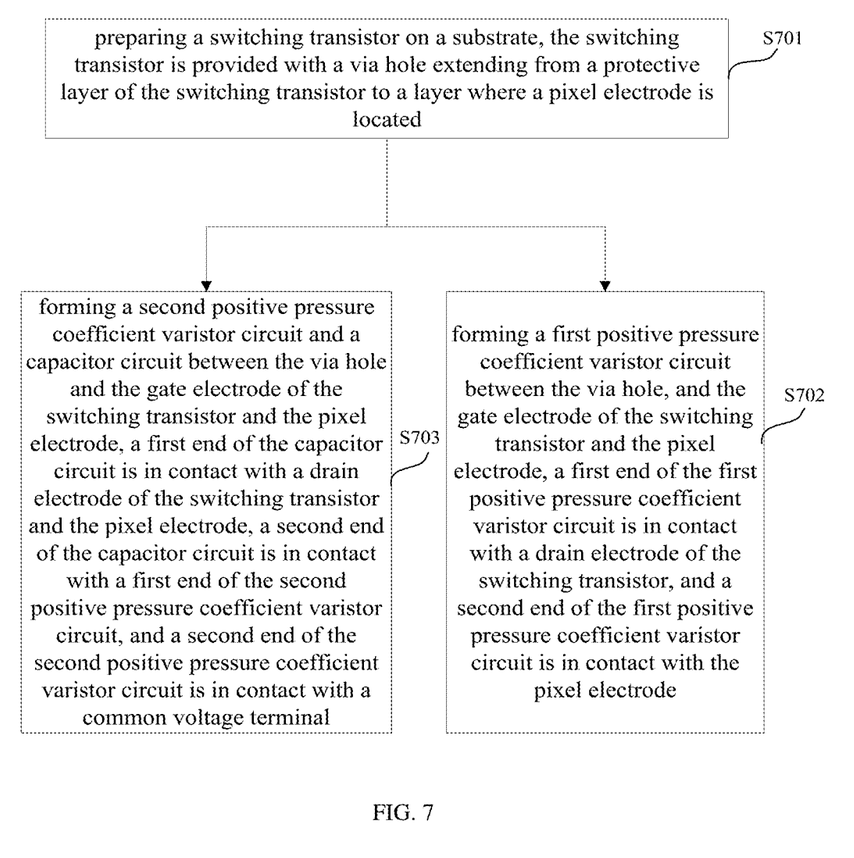
FIG. 7 illustrates a schematic flowchart of a method for preparing the pixel driving structure according to a fifth embodiment of the present application.

As shown in FIG. 7, a method for preparing a pixel driving structure includes a step S701, a step S702 and a step S703.

In the step of S701, a switching transistor 400 is prepared on a substrate. The switching transistor 400 is provided with a via hole 403 extending from a protective layer 405 of the switching transistor 400 to a layer where the pixel electrode 100 is located.

In the step of S702, a first positive pressure coefficient varistor circuit 300 is formed between the via hole 403, and a gate electrode 402 of the switching transistor 400 and a pixel electrode 100. A first end of the first positive pressure coefficient varistor circuit 300 is in contact with a drain electrode 401 of the switching transistor 400, and a second end of the first positive pressure coefficient varistor circuit 300 is in contact with the pixel electrode 100.

Exemplarily, a pressure-sensitive material is used to prepare the first positive pressure coefficient varistor circuit 300 between the via hole 403 and the gate electrode 402 of the switching transistor 400 and the pixel electrode 100.

In the step of S703, a second positive pressure coefficient varistor circuit 600 and a capacitor circuit 500 are formed between the via hole 403 and the gate electrode 402 of the switching transistor 400 and the pixel electrode 100. A first end of the capacitor circuit 500 is in contact with the drain electrode 401 of the switching transistor 400 and the pixel electrode 100, a second end of the capacitor circuit 500 is in contact with a first end of the second positive pressure coefficient varistor circuit 600, and a second end of the second positive pressure coefficient varistor circuit 600 is in contact with a common voltage terminal.

Exemplarily, the pressure-sensitive material is used to prepare the second positive pressure coefficient varistor circuit 600 between the via hole 403 and the gate electrode 402 of the switching transistor 400 and the pixel electrode 100, and the capacitor circuit 500 is formed between the gate electrode 402 of the switching transistor 400 and the pixel electrode 100.

Sixth Embodiment

Figure 8:
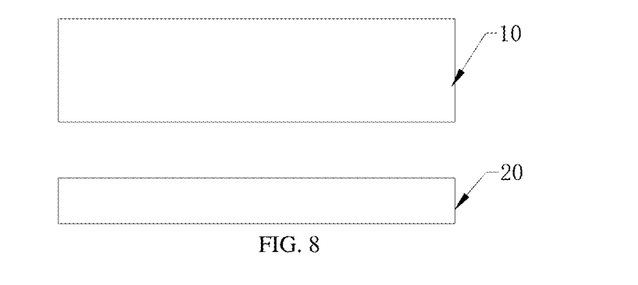
FIG. 8 is a schematic structural diagram of a display panel according to the sixth embodiment of the present application.

As shown in FIG. 8, a display panel includes the aforesaid pixel driving structure or the aforesaid pixel drive circuit. Where the pixel driving structure or the pixel drive circuit is arranged on a first side surface of an array substrate 10, a backlight panel 20 is arranged at a position adjacent to the first side surface of the array substrate 10, and a light-exiting surface of the backlight panel 20 for emitting light is adjacent to the first side surface of the array substrate 10, so that the backlight panel 20 can provide light source for the array substrate 10. The liquid crystal molecules of the liquid crystal layer are driven to be deflected at an angle to display an image that needs to be displayed with the cooperation of the backlight panel 20 and the array substrate 10. Since the display panel includes the pixel driving structure or includes the pixel drive circuit, the problem of occurrence of Trace Mura phenomenon of the display panel can be improved. Regarding the detail of the working principle of the display panel, reference can be made to the descriptions of the pixel driving structure, so that the detail of the working principle of the display panel are not repeatedly described herein.

The foregoing embodiments are only intended to explain the technical solutions of the present application, rather than limiting the technical solutions of the present application. Although the present application has been described in detail with reference to these embodiments, a person of ordinary skilled in the art should understand that, the technical solutions disclosed in the embodiments may also be amended, some technical features in the technical solutions may also be equivalently replaced. The amendments or the equivalent replacements don't cause the essence of the corresponding technical solutions to be deviated from the spirit and the scope of the technical solutions in the embodiments of the present application, and thus should all be included in the protection scope of the present application.

What is claimed is:

1. A pixel driving structure of a display panel, the display panel further comprising a backlight panel and an array panel, the pixel driving structure being arranged on a first side surface of the array substrate, the backlight panel being arranged at a position adjacent to the first side surface of the array substrate, the pixel driving structure comprising a switching transistor and a pixel electrode, the pixel driving structure further comprising:

a first positive pressure coefficient varistor circuit, wherein a first end of the first positive pressure coefficient varistor circuit is electrically connected with a drain electrode of the switching transistor, and a second end of the first positive pressure coefficient varistor circuit is electrically connected with the pixel electrode;

wherein the switching transistor is provided with a via hole extending from a protective layer of the switching transistor to a layer where the pixel electrode is located, the first positive pressure coefficient varistor circuit is formed between the via hole and a gate electrode of the switching transistor and the pixel electrode, the pixel electrode and the gate electrode of the switching transistor are located on the same layer, the first end of the first positive pressure coefficient varistor circuit is in contact with the drain electrode of the switching transistor, and the second end of the first positive pressure coefficient varistor circuit is in contact with the pixel electrode, such that the first positive pressure coefficient varistor circuit and the pixel electrode are constituted as a series circuit;

wherein when a hard object scratches across a surface of a display screen, the first positive pressure coefficient varistor circuit is extruded to be deformed to withstand an increased divided voltage, and a deformation of the first positive pressure coefficient varistor circuit causes a divided voltage on the pixel electrode to be decreased, thereby causing an electric field between the pixel electrode and the common electrode to become weaker, and thereby reducing deflection angles of liquid crystal molecules within the electric field;

when the first positive pressure coefficient varistor circuit is not extruded, the resistance value of the first positive pressure coefficient varistor circuit is less than a first preset value, and the first preset value is 1 ohm.

2. The pixel driving structure according to claim 1, wherein the first positive pressure coefficient varistor circuit comprises at least one positive pressure coefficient varistor.

3. The pixel driving structure according to claim 2, wherein the first positive pressure coefficient varistor circuit comprises at least two positive pressure coefficient varistors connected in series.

4. The pixel driving structure according to claim 1, wherein a scanning signal and a data signal are received at a gate electrode and a source electrode of the switching transistor, respectively;

the pixel driving structure further comprises a storage capacitor formed between the pixel electrode and the common electrode; and the common electrode is formed on a protective layer of the switching transistor.

5. The pixel driving structure according to claim 1, wherein the switching transistor is a thin film transistor (TFT) comprising a protective layer, a drain electrode, a source electrode, an active island, a gate insulating layer, and a gate electrode;

the protective layer is configured to be covered on the drain electrode and the source electrode, the drain electrode and the source electrode are configured to be covered on the active island, the active island comprises an ohmic contact layer and an active layer sequentially laminated and covered on the gate insulating layer, and the gate insulating layer is covered on the gate electrode.

6. A method for manufacturing a pixel driving structure of a display panel, the display panel further comprising a backlight panel and an array panel, the pixel driving structure being arranged on a first side surface of the array substrate, the backlight panel being arranged at a position adjacent to the first side surface of the array substrate, the method comprising:

preparing a switching transistor on a substrate, wherein the switching transistor is provided with a via hole extending from a protective layer of the switching transistor to a layer where a pixel electrode is located; and forming a first positive pressure coefficient varistor circuit between the via hole, and a gate electrode of the switching transistor and the pixel electrode, wherein the pixel electrode and the gate electrode of the switching transistor are located on the same layer, a first end of the first positive pressure coefficient varistor circuit is in contact with a drain electrode of the switching transistor, and a second end of the first positive pressure coefficient varistor circuit is in contact with the pixel electrode, the first positive pressure coefficient varistor circuit and the pixel electrode are constituted as a series circuit;

wherein when a hard object scratches across a surface of a display screen, the first positive pressure coefficient varistor circuit is extruded to be deformed to withstand an increased divided voltage, and a deformation of the first positive pressure coefficient varistor circuit causes a divided voltage on the pixel electrode to be decreased, thereby causing an electric field between the pixel electrode and the common electrode to become weaker, and thereby reducing deflection angles of liquid crystal molecules within the electric field;

when the first positive pressure coefficient varistor circuit is not extruded, the resistance value of the first positive pressure coefficient varistor circuit is less than a first preset value, and the first preset value is 1 ohm.

7. The method according to claim 6, wherein said forming the first positive pressure coefficient varistor circuit between the via hole and the gate electrode of the switching transistor and the pixel electrode comprises:

using a pressure-sensitive material to form the first positive pressure coefficient varistor circuit between the via hole and the gate electrode of the switching transistor and the pixel electrode.

* * * * *